(12) United States Patent
Enriquez Shibayama et al.

(10) Patent No.: US 9,113,555 B2
(45) Date of Patent: Aug. 18, 2015

(54) APPARATUS FOR DIFFERENTIAL FAR-END CROSSTALK REDUCTION

(71) Applicant: Intel Corporation, Santa Clara, CA (US)

(72) Inventors: Raul Enriquez Shibayama, Zapopan (MX); Xiaoning Ye, Portland, OR (US); Kai Xiao, University Place, WA (US); Benjamin Lopez Garcia, Puebla (MX)

(73) Assignee: Intel Corporation, Santa Clara, CA (US)

( * ) Notice: Subject to any disclaimer, the term of this patent is extended or adjusted under 35 U.S.C. 154(b) by 220 days.

(21) Appl. No.: 13/725,556

(22) Filed: Dec. 21, 2012

(65) Prior Publication Data

US 2014/0179162 A1 Jun. 26, 2014

(51) Int. Cl.
*H01R 13/66* (2006.01)
*H05K 1/02* (2006.01)
*H05K 1/16* (2006.01)

(52) U.S. Cl.
CPC ............ *H05K 1/0228* (2013.01); *H05K 1/0245* (2013.01); *H05K 1/0251* (2013.01); *H05K 1/162* (2013.01); *H05K 2201/09636* (2013.01); *Y10T 29/49147* (2015.01)

(58) Field of Classification Search
CPC .......... H05K 1/0237; H05K 3/22; H05K 3/00
USPC .......................... 439/55, 76.1, 620.01–620.09
See application file for complete search history.

(56) References Cited

U.S. PATENT DOCUMENTS

| | | | |
|---|---|---|---|
| 6,479,758 B1 | 11/2002 | Arima et al. | |
| 7,038,917 B2 * | 5/2006 | Vinciarelli et al. | 361/778 |
| 7,335,976 B2 * | 2/2008 | Chen et al. | 257/690 |
| 7,538,438 B2 * | 5/2009 | Yu et al. | 257/773 |
| 2003/0230791 A1 | 12/2003 | Tsuk et al. | |

FOREIGN PATENT DOCUMENTS

| | | |
|---|---|---|
| KR | 10-2004-0058583 A | 7/2004 |
| KR | 10-2011-0040684 A | 4/2011 |
| WO | 2014/099793 A1 | 6/2014 |

OTHER PUBLICATIONS

Hatirnaz et al., "Twisted Differential On-Chip Interconnect Architecture for Inductive/Capacitive Crosstalk Noise Cancellation", International Symposium on System-on-Chip 2003, Nov. 19-21, 2003, pp. 93-96. (English Abstract only).
International Search Report and Written Opinion received for PCT Patent Application No. PCT/US2013/075408, mailed on Apr. 30, 2014, 13 pages.

* cited by examiner

*Primary Examiner* — Khiem Nguyen
(74) *Attorney, Agent, or Firm* — International IP Law Group, P.L.L.C.

(57) ABSTRACT

A method of reducing crosstalk. The method may include forming a first contact over a first vertical conductor. The method may include forming a second contact over a second vertical conductor. The method may include forming a capacitive coupler between the first contact and the second contact, wherein the capacitive coupler is to cancel crosstalk received at the second vertical conductor from the first vertical conductor.

20 Claims, 5 Drawing Sheets

100

102

US 9,113,555 B2

APPARATUS FOR DIFFERENTIAL FAR-END CROSSTALK REDUCTION

TECHNICAL FIELD

This disclosure relates generally to techniques for reducing far-end crosstalk in differential signaling. Specifically, this disclosure relates to reducing differential far-end crosstalk by introducing extra crosstalk of opposite polarity from neighboring channels.

BACKGROUND ART

Computing devices may include a motherboard such as a printed circuit board (PCB). The motherboard may hold various components of the computing device such as a central processing unit (CPU) and memory, and may provide connections for other peripheral components. The CPU may be coupled to the motherboard via a packaging technology such as a land grid array (LGA), a pin grid array (PGA), and the like. A LGA is packaging for integrated circuits that is notable for having the pins on a socket rather than an integrated circuit that may be present in other packaging, such as in a PGA. In many packaging technologies, crosstalk is generated within the packaging. Crosstalk creates distortion in channels and in signals communicated through the channels.

BRIEF DESCRIPTION OF THE DRAWINGS

The same numbers are used throughout the disclosure and the figures to reference like components and features. Numbers in the 100 series refer to features originally found in FIG. 1; numbers in the 200 series refer to features originally found in FIG. 2; and so on.

DESCRIPTION OF THE EMBODIMENTS

The present disclosure relates generally to techniques for reducing crosstalk between channels. A channel is a pair of conductors that form a differential signal pair. A first channel may be adjacent to a second channel in a package configured to couple components to a printed circuit board (PCB). The first channel and the second channel may experience crosstalk generated between them at vertical conductors within the package. The crosstalk may create signal noise in either the first channel or the second channel. The crosstalk may be reduced by forming a capacitive coupler from a first contact of the first channel to a second contact at the second channel. The first contact may be configured to communicate a signal having a first polarity and the second contact may be configured to communicate a signal having a second polarity. The capacitive coupler may enable a reduction or cancellation of crosstalk due to the inverse polarity of the signals associated with the first and second contact, respectively.

Figure 1:
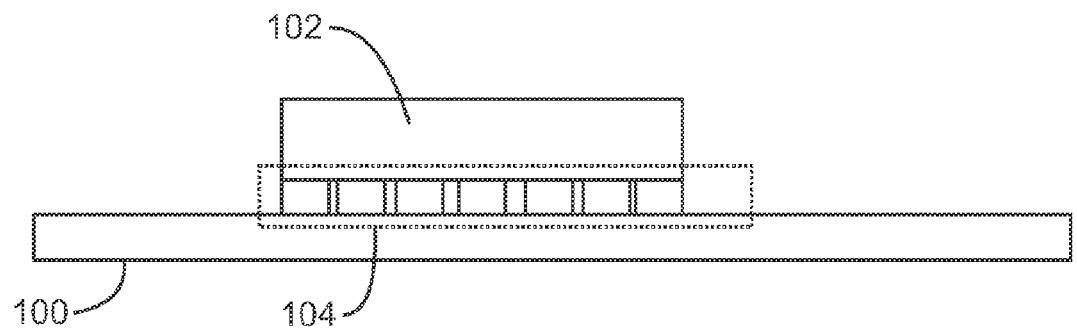
FIG. 1 is a block diagram showing a printed circuit board and a package to receive electronic components.

FIG. 1 is a block diagram showing a printed circuit board 100 (PCB) and a package 102 to receive electronic components. The package 102 may be a surface mount package configured to receive an electronic component and electrically couple the electronic component to the PCB 100. The package 102 may be communicatively coupled to the PCB 100 via conductive elements indicated by the dashed circle 104. The conductive elements 104 may include any suitable object for communicating electrical signals with the PCB 100. The package 102 may be configured to receive an electrical component such as a microchip, a processor, and the like.

Figure 2:
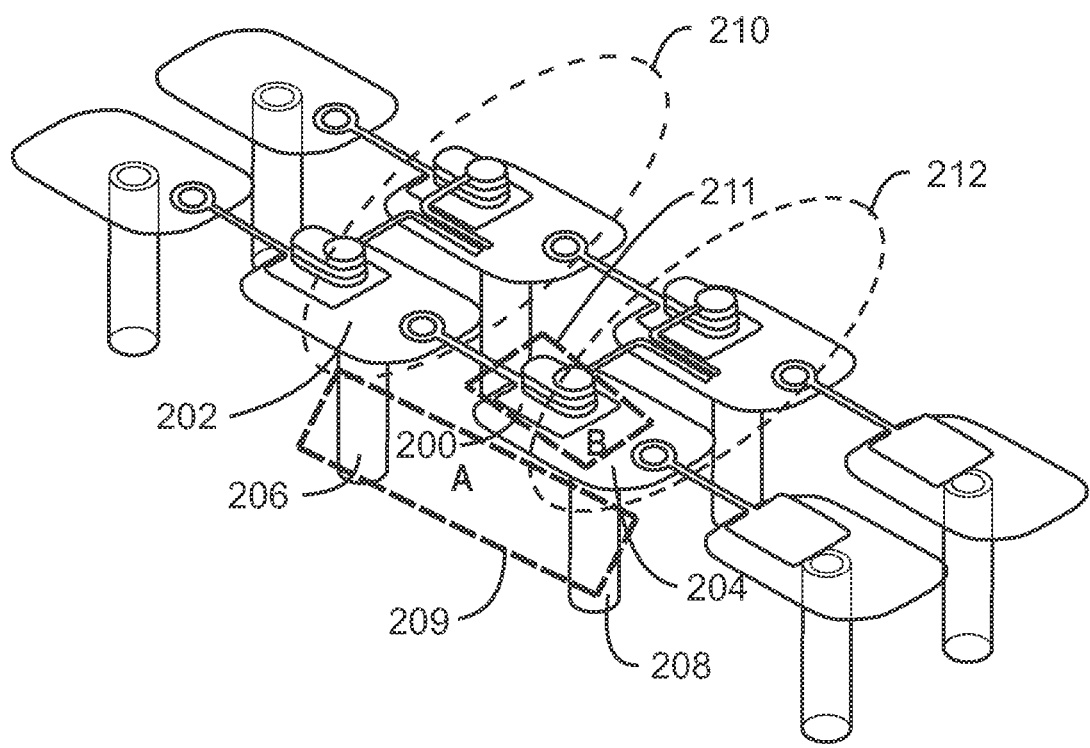
FIG. 2 is a perspective view showing a portion of the package including a first contact and a second contact.

FIG. 2 is a perspective view showing a portion of the package 102 including a first contact 202 and a second contact 204. The first contact 202 may be coupled to a first vertical conductor 206. The second contact 204 may be coupled to a second vertical conductor 208. The first contact 202 may be associated with a first channel, and the second contact 204 may be associated with a second channel.

A "channel," as referred to herein, is a differential pair of signals. The first contact 202 may be one contact of a first pair of contacts, indicated by the dashed circle 210, to communicate differential signals with respect to each other. The second contact 204 may be one contact of a second pair of contacts, indicated by the dashed circle 212, to communicate differential signals with respect to each other.

In other words, each of the first pair of contacts 210 and the second pair of contacts 212 may be a differential pairs of contacts. For example, the first pair of contacts 210 may be associated with channel "A" configured to communicate data signals A− and A+. Likewise, the second pair of contacts 212 may be associated with channel "B" configured to communicate data signals B− and B+.

Crosstalk may be generated between the first channel and the second channel. The crosstalk may be generated based on the proximity of the first vertical conductor 206 to the second vertical conductor 208. In some embodiments, the crosstalk is generated between the first vertical conductor 206 and the second vertical conductor 208 based on the proximity of the first vertical conductor 206 to the second vertical conductor 208.

The capacitive coupler 200 disposed between the first contact 202 and the second contact 204. The capacitive coupler 200 may be configured to cancel crosstalk generated between the first vertical conductor 206 and the second vertical conductor 208 by introducing crosstalk having an opposite polarity as the crosstalk generated. As illustrated in FIG. 2, the first vertical conductor 206 generates an unwanted crosstalk "A", as indicated by the dashed square 209, with a first polarity, such as positive polarity. The capacitive coupler 200 may introduce the signal "B", as indicated by the dashed square 211, having a second polarity that is opposite polarity from the first polarity, such as a negative polarity, at the second contact 204. The introduction of a crosstalk having an opposite polarity at to the second contact 204 may reduce the unwanted crosstalk generated between the first vertical conductor 206 and the second vertical conductor 208.

Figure 3:
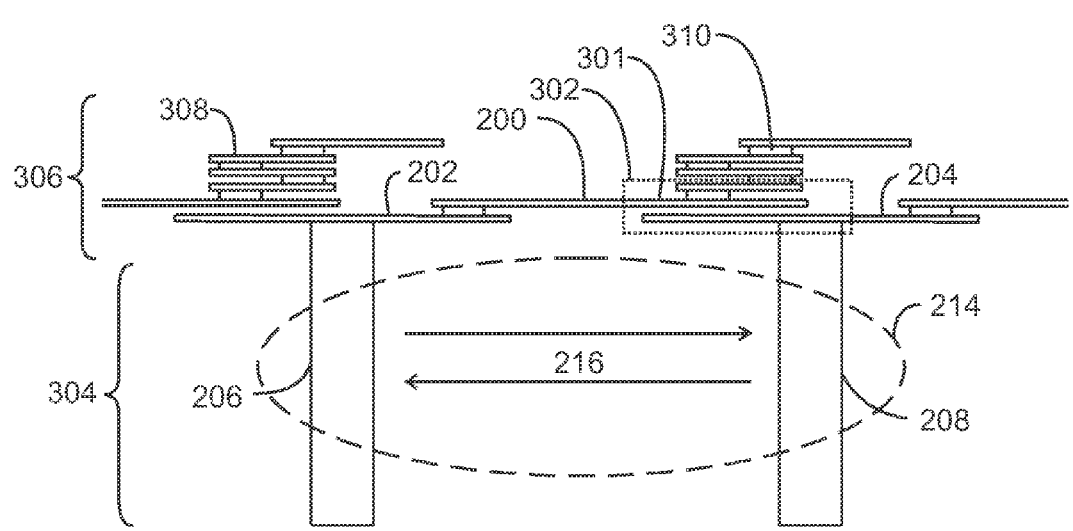
FIG. 3 is a side view showing a portion of the package including the capacitive coupler between the first contact and the second contact.

FIG. 3 is a side view showing a portion of the package 102 including the capacitive coupler 200 between the first contact 202 and the second contact 204. The capacitive coupler 200 may include a conductive plate 301 disposed above the second contact 204 to form a parallel-plate capacitor, as indicated by the dashed line 302, with the second contact 204. In some embodiments, a dielectric material may be included in between the conductive plate 301 and the second contact 204. As indicated by the dashed oval 214, crosstalk is generated between the vertical conductors 206, 208. As indicated by the arrows at 216, the crosstalk is provided from the first vertical conductor 206 to the second vertical conductor 208, and vice versa. The capacitive coupler 200 may be configured to introduce crosstalk to reduce or cancel the crosstalk generated between the vertical conductors 206, 208. By introducing the crosstalk by the capacitive coupler 200, crosstalk of the first channel in the first polarity may reduce or cancel the crosstalk of the second channel having a second polarity that is opposite of the first polarity.

The package 102 may include interconnects 308, 310 composed of any suitable conductive material. The interconnects 308, 310 may be configured to provide signals to additional contacts within the package 102. In some embodiments, the interconnects 308, 310 may be configured to be communicatively coupled to an electronic component (not shown) such as a microchip, processor, or the like.

Figure 4:
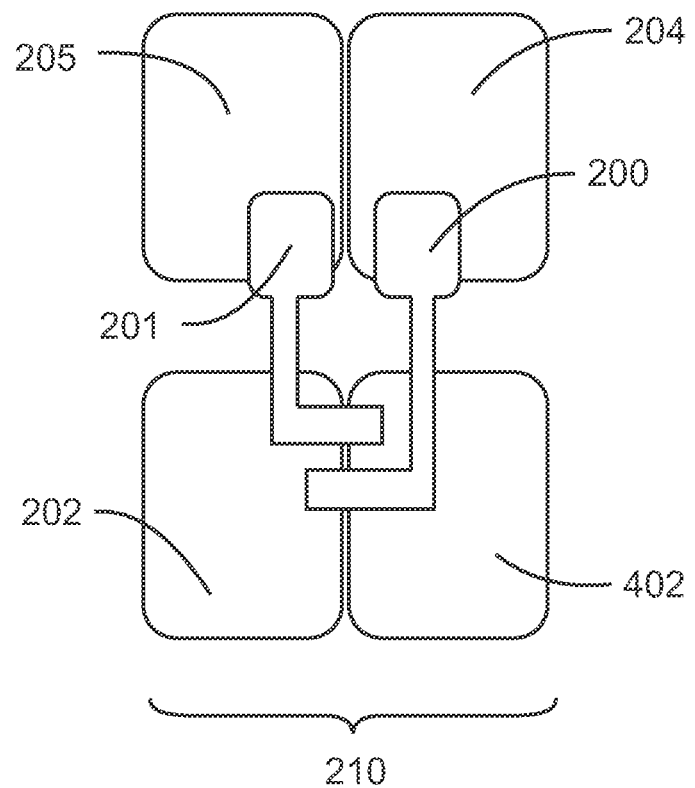
FIG. 4 is a top view showing a capacitive coupler between the first and second contact via a third contact.

FIG. 4 is a top view showing a capacitive coupler 200 between the first contact 202 and the second contact 204. In some embodiments, the vertical conductor 206, discussed in reference to FIG. 3 above, of the first pair of contacts 210 may introduce a crosstalk. The crosstalk may have the same polarity as a signal associated with an adjacent contact 205. In this embodiment, the second contact 204 is not adjacent to the first contact 202 as illustrated in FIG. 3. In order to invert the polarity the capacitance coupler 200 of the first contact 202 is coupled to the second contact 204 by routing the capacitance coupler 200 over a third contact 402 of the first pair of contacts 210. Correspondently, a capacitance coupler 201 of the second contact 402 of the first pair of contacts 210 is coupled to the adjacent contact 205 instead of the third contact 204.

Figure 5:
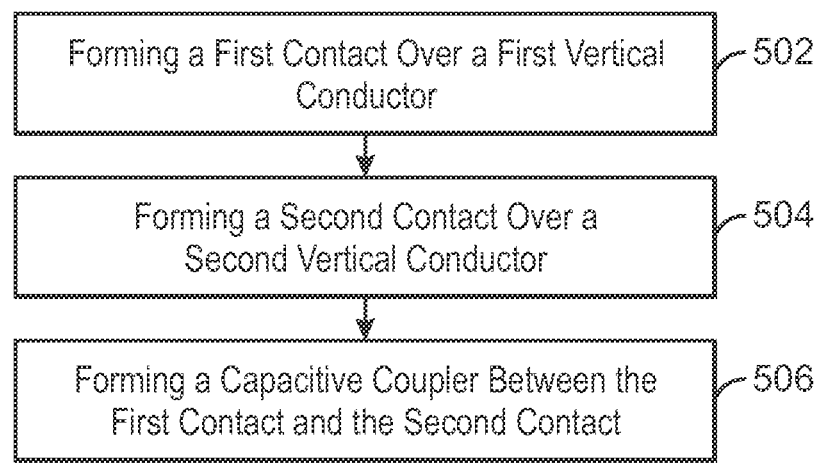
FIG. 5 is a block diagram showing a method of manufacturing a printed circuit board to reduce crosstalk between contacts.

FIG. 5 is a block diagram showing a method 500 of manufacturing a printed circuit board to reduce crosstalk between contacts. The method 500 may include forming, at block 502, a first contact over a first vertical conductor. The method 500 may include forming, at block 504, a second contact over a second vertical conductor. The method 500 may include forming, at block 506 a capacitive coupler between the first contact and the second contact, wherein the capacitive coupler is to cancel crosstalk received at the second vertical conductor from the first vertical conductor.

The first contact and the second contact may be associated with opposite polarities with respect to each other. For example, the first contact may be associated with a first polarity and the second contact may be associated with a second polarity that is opposite to the first polarity. The capacitive coupler is formed to create a conductive coupling to the first contact and a capacitive coupling to the second contact. The capacitive coupler may include a conductive plate disposed above the second contact to form a parallel-plate capacitor. The capacitive coupler may introduce crosstalk between the first and second contacts that may reduce or cancel crosstalk between the first vertical conductor and the second vertical conductor.

In some embodiments, the method 500 may include forming a third contact over the first vertical conductor. In this embodiment, first contact and the third contact are associated with a first channel. The first and third contact may be configured to communicate differential signals with respect to each other. In some embodiments, the method 500 may include forming a route over the third contact, when the first and the second contact are not adjacent to each other.

In some embodiments, the method 500 may include forming a fourth contact over the second vertical conductor wherein the second contact and fourth contact are associated with a second channel. In this embodiment, the second and fourth contact may be configured to communicate differential signals with respect to each other.

An embodiment is an implementation or example. Reference in the specification to "an embodiment," "one embodiment," "some embodiments," "various embodiments," or "other embodiments" means that a particular feature, structure, or characteristic described in connection with the embodiments is included in at least some embodiments, but not necessarily all embodiments, of the present techniques. The various appearances of "an embodiment," "one embodiment," or "some embodiments" are not necessarily all referring to the same embodiments.

Not all components, features, structures, characteristics, etc. described and illustrated herein need be included in a particular embodiment or embodiments. If the specification states a component, feature, structure, or characteristic "may", "might", "can" or "could" be included, for example, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

It is to be noted that, although some embodiments have been described in reference to particular implementations, other implementations are possible according to some embodiments. Additionally, the arrangement and/or order of circuit elements or other features illustrated in the drawings and/or described herein need not be arranged in the particular way illustrated and described. Many other arrangements are possible according to some embodiments.

In each system shown in a figure, the elements in some cases may each have a same reference number or a different reference number to suggest that the elements represented could be different and/or similar. However, an element may be flexible enough to have different implementations and work with some or all of the systems shown or described herein. The various elements shown in the figures may be the same or different. Which one is referred to as a first element and which is called a second element is arbitrary.

It is to be understood that specifics in the aforementioned examples may be used anywhere in one or more embodiments. For instance, all optional features of the computing device described above may also be implemented with respect to either of the methods or the computer-readable medium described herein. Furthermore, although flow diagrams and/or state diagrams may have been used herein to describe embodiments, the techniques are not limited to those diagrams or to corresponding descriptions herein. For example, flow need not move through each illustrated box or state or in exactly the same order as illustrated and described herein.

The present techniques are not restricted to the particular details listed herein. Indeed, those skilled in the art having the benefit of this disclosure will appreciate that many other variations from the foregoing description and drawings may be made within the scope of the present techniques. Accordingly, it is the following claims including any amendments thereto that define the scope of the present techniques.

What is claimed is:

1. An apparatus, comprising:
   a first contact coupled to a first vertical conductor;
   a second contact coupled to a second vertical conductor; and
   a capacitive coupler between the first contact and the second contact, wherein the capacitive coupler is to cancel crosstalk received at the second vertical conductor from the first vertical conductor, wherein the capacitive coupler comprises a conductive plate disposed above the second contact to form a parallel-plate capacitor with the second contact.

2. The apparatus of claim 1, wherein the first contact is associated with a first channel, and wherein the first contact is one contact of a first pair of contacts to communicate differential signals with respect to each other.

3. The apparatus of claim 2, wherein the second contact is associated with a second channel, and wherein the second contact is one contact of a second pair of contacts to communicate differential signals with respect to each other.

4. The apparatus of claim 2, wherein the capacitive coupler is routed over a third contact, wherein the third contact is a member of the first pair of contact.

5. The apparatus of claim 1, wherein the first vertical conductor and the second vertical conductor are associated with a first crosstalk polarity, and the capacitive coupler between the first and second contact is associated with a second crosstalk polarity opposite from the first crosstalk polarity.

6. The apparatus of claim 1, wherein the capacitive coupler is conductively coupled to the first contact, and capacitively coupled to the second contact.

7. A printed circuit board, comprising:
 a first contact of a first differential pair of contacts communicatively coupled to a first pair of vertical conductors;
 a second contact of a second differential pair of contacts communicatively coupled to a second pair of vertical conductors;
 a coupler between the first contact and the second contact to reduce crosstalk between the first differential pair and the second differential pair, wherein the coupler comprises a conductive plate disposed above the second contact to form a parallel-plate capacitor with the second contact.

8. The printed circuit board of claim 7, comprising:
 a first vertical conductor of the first pair of vertical conductors communicatively coupled to the first contact and extending into the printed circuit board; and
 a second vertical conductor of the second pair of vertical conductors communicatively coupled to the second contact and extending into the printed circuit board, wherein the first vertical conductor and the second vertical conductor enable the crosstalk.

9. The printed circuit board of claim 8, wherein the first vertical conductor and the second vertical conductor are associated with a first crosstalk polarity, and the coupler between the first and second contact is associated with a second crosstalk polarity opposite from the first crosstalk polarity.

10. The printed circuit board of claim 7, wherein the first contact is associated with a first channel and the second contact is associated with a second channel, and wherein the first channel is in a first circuit and second channel is in a second circuit.

11. The printed circuit board of claim 7, wherein the first contact is adjacent to the second contact, and wherein adjacent contacts are configured to communicate signals having a polarity opposite from each other in different channels.

12. A method, comprising:
 forming a first contact over a first vertical conductor;
 forming a second contact over a second vertical conductor;
 forming a capacitive coupler between the first contact and the second contact, wherein the capacitive coupler is to cancel crosstalk received at the second vertical conductor from the first vertical conductor, wherein the capacitive coupler comprises a conductive plate disposed above the second contact to form a parallel-plate capacitor with the second contact.

13. The method of claim 12, the method comprising forming a third contact over a third vertical conductor wherein the first contact and the third contact are associated with a first channel, and wherein the first contact and third contact are to communicate differential signals with respect to each other.

14. The method of claim 13, the method comprising forming a fourth contact over a fourth vertical conductor wherein the second contact and fourth contact are associated with a second channel, and wherein the second contact and fourth contact are to communicate differential signals with respect to each other.

15. The method of claim 13, the method comprising forming a route over the third contact when the first contact and the second contact are not adjacent to each other.

16. The method of claim 12, wherein the first vertical conductor and the second vertical conductor are associated with a first crosstalk polarity and the capacitive coupler between the first contact and the second contact is associated with a second crosstalk polarity opposite from the first crosstalk polarity.

17. The method of claim 12, wherein the capacitive coupler is formed to create a conductive coupling to the first contact and a capacitive coupling to the second contact.

18. The apparatus of claim 1, further comprising a dielectric material between the conductive plate and the second contact.

19. The method of claim 12, further comprising further comprising disposing a dielectric material between the conductive plate and the second contact.

20. The printed circuit board of claim 7, further comprising a dielectric material between the conductive plate and the second contact.

* * * * *